(12) United States Patent
Barr et al.

(10) Patent No.: US 8,470,717 B2
(45) Date of Patent: Jun. 25, 2013

(54) METHOD OF FORMING CURRENT TRACKS ON SEMICONDUCTORS

(75) Inventors: Robert K. Barr, Shrewsbury, MA (US); Hua Dong, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 112 days.

(21) Appl. No.: 13/110,879

(22) Filed: May 18, 2011

(65) Prior Publication Data

US 2011/0287634 A1   Nov. 24, 2011

Related U.S. Application Data

(60) Provisional application No. 61/345,932, filed on May 18, 2010.

(51) Int. Cl.
*H01I 21/361* (2006.01)

(52) U.S. Cl.
USPC ........... 438/756; 438/736; 438/745; 438/757; 430/313

(58) Field of Classification Search
USPC ................. 438/725, 737, 750, 745, 743, 754, 438/756, 757; 430/130, 313, 314
See application file for complete search history.

(56) References Cited

U.S. PATENT DOCUMENTS

| | | |
|---|---|---|
| 4,040,897 A | 8/1977 | Blish et al. |
| 4,087,367 A | 5/1978 | Rioult et al. |
| 4,269,654 A | 5/1981 | Deckert et al. |
| 4,569,722 A | 2/1986 | Maury et al. |
| 5,417,807 A | 5/1995 | Fossas et al. |
| 5,541,246 A | 7/1996 | Dandreaux et al. |
| 5,624,483 A | 4/1997 | Fujioka |
| 5,762,696 A | 6/1998 | Jordan |
| 5,763,565 A | 6/1998 | Williams et al. |
| 5,801,103 A | 9/1998 | Rasmussen et al. |
| 5,872,046 A | 2/1999 | Kaeriyama et al. |
| 5,885,477 A | 3/1999 | Rasmussen et al. |
| 5,965,196 A | 10/1999 | Sawada |
| 6,027,790 A | 2/2000 | Rasmussen et al. |
| 6,033,996 A | 3/2000 | Rath et al. |
| 6,057,224 A | 5/2000 | Bothra et al. |
| 6,184,153 B1 | 2/2001 | Rasmussen et al. |
| 7,030,034 B2 | 4/2006 | Fucsko et al. |
| 7,888,168 B2 * | 2/2011 | Weidman et al. ............... 438/98 |
| 2004/0129344 A1 | 7/2004 | Hitoshi et al. |
| 2009/0008787 A1* | 1/2009 | Wenham et al. .............. 257/773 |
| 2009/0308435 A1 | 12/2009 | Calger |
| 2010/0104963 A1* | 4/2010 | Carlini et al. ................... 430/56 |
| 2010/0175752 A1* | 7/2010 | Wang et al. ................... 136/256 |
| 2010/0252095 A1 | 10/2010 | Senda et al. |

FOREIGN PATENT DOCUMENTS

| | | |
|---|---|---|
| EP | 1 578 854 B1 | 1/2009 |
| GB | 1253092 | 11/1971 |
| JP | 2005158808 A | 6/2005 |
| WO | 2004/113430 A1 | 12/2004 |
| WO | WO 2005/011979 A2 | 2/2005 |
| WO | WO 2005/013323 A2 | 2/2005 |

OTHER PUBLICATIONS

European Search Report of corresponding European Application No. 11 16 6305.

* cited by examiner

*Primary Examiner* — Lan Vinh

(74) *Attorney, Agent, or Firm* — John J. Piskorski

(57) ABSTRACT

Methods of making current tracks for semiconductors are disclosed. The methods involve selectively depositing a hot melt ink resist containing rosin resins and waxes on a silicon dioxide or silicon nitride layer coating a semiconductor followed by etching uncoated portions of the silicon dioxide or silicon nitride layer with an inorganic acid etch to expose the semiconductor and simultaneously inhibit undercutting of the hot melt ink resist. The etched portions may then be metallized to form a plurality of substantially uniform current tracks.

17 Claims, No Drawings

METHOD OF FORMING CURRENT TRACKS ON SEMICONDUCTORS

This application claims the benefit of priority under 35 U.S.C. §119(e) to U.S. Provisional Application No. 61/345,932, filed May 18, 2010, the entire contents of which application are incorporated herein by reference.

The present invention is directed to a method of forming substantially uniformly dimensioned current tracks on semiconductors. More specifically, the present invention is directed to a method of forming substantially uniformly dimensioned current tracks on semiconductors using a combination of a hot melt resist and an inorganic acid etch containing a polyol to inhibit undercutting.

The manufacture of semiconductor devices, such as photovoltaics and solar cells, involves the formation of electrically conductive contacts or current tracks on front and back sides of semiconductors. The metal coating must be able to establish ohmic contact with the semiconductor in order to ensure that charge carriers emerge from the semiconductor into the electrically conductive contacts without interference. In order to avoid current loss, metallized contact grids must have adequate current conductivities, i.e. a high conductivity or a sufficiently high conductor track cross section.

Numerous processes which meet the above requirements exist for metal coating the back side of solar cells. For example, in order to improve current conduction at the back side of solar cells, p-doping directly under the back side is reinforced. Usually aluminum is used for this purpose. The aluminum is applied, for example, by vapor deposition or by being printed onto the back side and being driven in or, respectively, alloyed in. Metal coatings using thick-film techniques are conventional methods for metallizing conductor tracks. Pastes used include metal particles and are electrically conductive as a result. The pastes are applied by screen, mask, pad printing or paste writing. A commonly used process is the screen printing process where finger-shaped metal coating lines having a minimum line width of 80 µm to 100 µm are made. Even at this grid width electrical conductivity losses are evident in comparison with a pure metal structure. This can have an adverse effect on the series resistance and on the filling factor and efficiency of the solar cell. This effect is intensified at smaller printed-on conductor track widths because the process causes the conductor tracks to become flatter. Nonconductive oxide and glass components between the metal particles constitute a fundamental cause of this reduced conductivity.

When metal coating the front sides, or light incidence sides, the objective is to achieve the least amount of shading of the active semiconductor surface in order to use as much of the surface as possible for capturing photons. Complex processes for producing the front side contacts make use of laser and other imaging techniques for the definition of the conductor track structures. The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

An anti-reflective layer is added to the front side or emitter layer of the wafer. In addition the anti-reflective layer may serve as a passivation layer. Suitable anti-reflective layers include silicon oxide layers such as $SiO_x$, silicon nitride layers such as $Si_3N_4$, or a combination of silicon oxide and silicon nitride layers. In the foregoing formulae, x is the number of oxygen atoms, typically x is the integer 2. Such anti-reflective layers may be deposited by a number of techniques, such as by various vapor deposition methods, for example, chemical vapor deposition and physical vapor deposition.

An opening or pattern is then defined on the front side. The pattern reaches through the antireflective layer to expose the surface of the semiconductor body of the wafer. A variety of processes may be used to form the pattern, such as, but not limited to, laser ablation, mechanical means, chemical and lithographic processes. Such mechanical means include sawing and scratching. Typical photolithographic processes include disposing an imageable material on the surface of the wafer, patterning the imageable material to form openings in the anti-reflective layer, transferring the pattern to the wafer, depositing a metal layer in the openings and removing the imageable material. An example of a chemical method of forming an opening on the front side is etching with an etching composition, such as a buffered oxide etch. Such buffered oxide etches may include one or more inorganic acids in combination with a buffering agent, such as an ammonium compound. Prior to the etching step, a mask which is resistant to the etching activity of the etchant is applied in a pattern negative to that of the sites of the current tracks. After etching the mask is usually removed prior to metallization of the current tracks.

A major problem which often arises during formation of the current tracks is undercutting. This results in defective and inefficient semiconductor devices. This problem is common when the current tracks are formed using an etching method in combination with a mask. Upon application of the etch to the selectively masked semiconductor the etch may not only remove portions of the antireflective layer not covered by the mask but by capillary action seep under the mask at the interface of the mask and the antireflective layer causing portions of the antireflective layer covered by the mask to be undesirably etched away. This results in current tracks having irregular widths which results in irregular and non-uniform current flow in the final metalized device. In addition, such undercutting may form tributaries which adjoin adjacent current tracks resulting in electrical shorts.

As the industry seeks to manufacture semiconductor devices using thinner and more delicate semiconductor wafers and at the same time increase the plurality of current tracks on the front side of the wafers to increase electrical out-put, the problem becomes compounded by difficulty of working with smaller and more delicate materials. In addition, current tracks with smaller dimensions reduce shadowing. When the semiconductor is used as a means of collecting incident radiation, such as in photovoltaic devices and solar cells, large current tracks may block incident light from impinging on the antireflection layer, thus reducing the amount of incident light which is absorbed by the semiconductor with the result of compromising the efficiency of the photovoltaic device or solar cell. Accordingly, there is a need for a method which substantially reduces or eliminates the problem of undercutting in the formation of current tracks on semiconductor wafers and permits the formation of fine line current tracks.

In one embodiment methods include: a) providing a semiconductor including a front side and a back side, the front side includes an antireflective layer composed of $SiO_x$, silicon nitride or combinations thereof; b) selectively applying a hot melt ink resist including one or more hydrogenated rosin resins having acid functional groups, and one or more fatty acids to the antireflective layer, the hot melt ink resist has an acid number of at least 190; and c) applying an etch composition including one or more inorganic acids to the semiconductor to etch away exposed portions of the semiconductor antireflective layer and simultaneously inhibit undercutting.

In another embodiment methods include: a) providing a semiconductor including a front side and a back side, the front side includes a doped emitter layer, b) selectively applying a hot melt ink resist including one or more hydrogenated rosin resins having acid functional groups, and one or more fatty acids to the doped emitter layer, the hot melt ink resist has an acid number of at least 190; and c) applying an etch composition including one or more inorganic acids to the semiconductor to etch away exposed portions of the doped emitter layer and simultaneously inhibit undercutting.

The methods enable the formation of a plurality of current tracks on semiconductors which have reduced or no detectable undercutting in the antireflective layer or coated portions of the doped emitter layer. This enables metal current tracks to have uniform dimensions and provides a semiconductor device with uniform current flow and increased electrical out-put in contrast to many conventional semiconductor devices made with conventional methods. Short circuiting of adjacent current tracks due to interconnecting tributaries is reduced or eliminated. The methods also enable the formation of current tracks with fine line dimensions, thus increasing the plurality of current tracks on a semiconductor as well as enabling the formation of current tracks on smaller sized wafers. Further, by reducing the size of the current tracks undesirable shadowing is reduced or eliminated, thus reducing shadowing and enabling an increase in the absorption of incident light by the semiconductor device. The hot melt ink resist is of such a composition that it provides sufficient adhesion at an interface with the antireflective layer or emitter layer to inhibit seepage of the etchant under the hot melt ink resist due to capillary action. In addition, the hot melt ink resist may be readily and rapidly removed from the surface of the antireflective layer or doped emitter layer by dissolving rather than swelling and lifting using aqueous alkaline solutions without concern that any remaining residue may compromise metal plating or contaminate the final device. This permits easy waste treatment because the dissolved resist may be precipitated out by neutralization. Also, this permits less periodic maintenance on equipment.

The etchant used to selectively remove the antireflective layer is compatible with the hot melt ink resist such that it does not chemically interact with the ink resist and does not seep under the hot melt inkjet resist at the interface of the ink resist and the antireflective layer or emitter layer. The etchant is applied under mild conditions, thus reducing hazards to workers using it.

As used throughout this specification, the terms "depositing" and "plating" are used interchangeably. The terms "current tracks" and "current lines" are used interchangeably. The terms "composition" and "bath" are used interchangeably. The indefinite articles "a" and "an" are intended to include both the singular and the plural. The term "selectively depositing" means that deposition of a material occurs in specific desired areas on a substrate. The term "resist" means a composition which is not physically or chemically altered by etchants containing inorganic or organic acids. The term "hydrogenated" means a chemical compound where part or all of its unsaturated chemical bonds (—C═C—) have been chemically treated to break or saturate the bonds with hydrogen (—$CH_2$—$CH_2$—).

The following abbreviations have the following meanings unless the context clearly indicates otherwise: ° C.=degrees Celsius; g=grams; mg=milligrams; cps=centipoise, 1 cps=1× $10^{-3}$ pascals (Pas)=0.01 poise=$1.02×10^{-4}$ $kps/m^2$; A=amperes; dm=decimeter; μm=micrometers; nm=nanometers; and UV=ultra violet.

All percentages and ratios are by weight unless otherwise indicated. All ranges are inclusive and combinable in any order except where it is clear that such numerical ranges are constrained to add up to 100%.

Photovoltaics and solar cells may be composed of monocrystalline or polycrystalline or amorphous silicon semiconductor wafers. While the description below is with regard to silicon semiconductor wafers, other suitable semiconductor wafers, such as gallium-arsenide, silicon-germanium, and germanium, may also be used. When silicon wafers are used, they typically have a p-type base doping.

The front side of the wafer may optionally be subjected to crystal-oriented texture etching in order to impart to the surface an improved light incidence geometry which reduces reflections. To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

In one embodiment an anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, or a combination of silicon oxide and silicon nitride layers. In the foregoing formulae, x is the number of oxygen atoms, typically x is the integer 2, i.e., silicon dioxide. Such anti-reflective layers may be deposited by a number of techniques, such as by various vapor deposition methods, for example, chemical vapor deposition and physical vapor deposition. While there is no thickness limitation on the silicon oxide and silicon nitride layers, typically, they are 100 nm to 250 nm thick.

The hot melt ink resists may be selectively deposited by inkjet printing, aerosol or screen printing. The hot melt ink resists are selectively applied to form an image which is negative to the current tracks. WO 2005/013323 and WO 2005/011979 disclose methods of screen printing resists in the manufacture of photovoltaic devices. Preferably, the hot melt ink resists are selectively applied to antireflective layers using inkjet printing or aerosol. More preferably, they are selectively applied using inkjet printing. Viscosities of the hot melt ink resist during application by inkjet printing or aerosol range from 7 cps to 21 cps, preferably from 9 cps to 15 cps. Most preferably the hot melts are applied at viscosities of 10 cps to 12 cps.

In another embodiment the hot melt ink resists may be selectively deposited by inkjet printing, aerosol or screen printing directly to the doped emitter layer prior to application of any antireflective layer. This is known as the selective emitter embodiment. In the selective emitter embodiment the hot melt ink resist forms an image which is positive to the current tracks. Typically in this embodiment the emitter layer is more heavily doped, such as n++ doping.

The inkjet printing method may be a continuous inkjet method or a drop-on-demand method. The continuous method is a printing method where the direction of the ink resist is adjusted by changing an electromagnetic field while continuously jetting the ink resist using a pump. The drop-on-demand is a method which dispenses the ink resist only when needed on an electronic signal. Drop-on-demand may be divided into a piezoelectric ink jet method where pressure is generated by using a piezoelectric plate causing a mechanical change by electricity and a thermal ink jet method using pressures which are generated by the expansion of bubbles produced by heat.

In contrast to the inkjet printing method, the aerosol method first forms an aerosol of the ink resist. The aerosol is guided to the semiconductor substrate via a pressurized nozzle with the pressurized nozzle being mounted to a print head. The aerosol is mixed with a focusing gas and is transported to the pressurized nozzle in a focused form. The use of focusing gas to dispense the ink resist reduces the probability of clogging the nozzles and also enables the formation of finer current tracks, a greater aspect ratio than with an inkjet apparatus.

The hot melt ink resists are applied to the surface of the antireflective layer or doped emitter layer at temperatures of 95° C. and less, preferably 65° C. to 90° C. More preferably, the hot melt inkjet resists are applied at temperatures of 70° C. to 80° C. Such low inkjet temperatures allow the inks to be used in most inkjet printhead modules or aerosols. Also, the ink resist has longer shelf life under low temperatures. The hot melt ink resists rapidly harden after application and adhere to the surface of the antireflective layer or doped emitter layer such that no hardening agents or cross-linking agents are required in the formulation. Accordingly, UV application steps and other conventional hardening steps may be eliminated from the methods.

Typically the hot melt ink resists are applied to semiconductor substrates which include an antireflective layer or doped emitter layer without metal components. Although there is no limitation on the thickness of current lines made with the methods, typically, the hot melt ink resists are selectively applied to a coating of $SiO_x$ or silicon nitride or doped emitter layer to form current lines having widths of 100 μm or less, or such as from 80 μm to 20 μm, or such as from 70 μm to 30 μm.

The hot melt ink resists include one or more hydrogenated rosin resins which include as a main component hydrogenated or partially hydrogenated rosin acids or salts thereof which are derived from rosin acids of the abietic and pimaric types with a general formula $C_{19}H_{29}COOH$ with a phenanthrene nucleus. Isomers include, but are not limited to, levopimaric acid, neoabietic acid, palustric acid, dehydroabietic acid, dihydroabietic acid (3 probable) and tetrahydroabietic acid. The average weight molecular weight ranges from 300 to 308, or such as from 302 to 306. The acid number is at least 150, or such as from 155 to 200, or such as from 170 to 190 (mg KOH/g). Rosin is derived from pine trees (chiefly *Pinus palustris* and *Pinus elliotii*). Gum rosin is the residue obtained after distillation of turpentine oil form the oleoresin tapped from living trees. Wood rosin is obtained by extracting pine stumps with naphtha and distilling off the volatile fraction. Tall oil is co-product of the fractionation of tall oil. Hydrogenated rosin resins may be obtained commercially or extracted from their natural sources and refined according to methods disclosed in the literature. An example of a commercially available partially hydrogenated rosin resin is STAYBELITE® A hydrogenated rosin available from Pinova Incorporated. Another commercially available partially hydrogenated rosin resin is STAYBELITE® Resin-E. A commercially available fully hydrogenated rosin is FORAL™ AX-E. In general, hydrogenated rosin resins may be included in the hot melt ink resists in amount of greater than or equal to 10 wt %, or such as from 10 wt % to 40 wt %, or such as from 20 wt % to 30 wt %.

The hot melt ink resists also include one or more fatty acids or salts thereof having a formula $R^1COO-M$ where $R^1$ is a linear, branched or cyclic alkyl or alkenyl group having 7 to 48 carbon atoms, preferably 12 to 24 carbon atoms and M is hydrogen or a counterion such as sodium, potassium, calcium ammonium or $NH_y(CH_2CH_2OH)_z$ where y and z are integers from 0 to 4 and their sum is always 4. Such fatty acids include, but are not limited to, caprylic acid, capric acid, lauric acid, linoleic acid, myristic acid, oleic acid, palmitic acid and stearic acid or salts thereof. Typically, the fatty acids are chosen from lauric acid, linoleic acid, myristic acid, palmitic acid, stearic acid and salts thereof. Preferably the fatty acids are chosen from myristic acid, palmitic acid and salts thereof. Such fatty acids and salts thereof have acid numbers of 200 and greater, typically, from 215 to 250 (mg KOH/g). Many of the fatty acids or salts thereof may be derived from natural oils, such as marine, rapeseed, tallow, tall oil, soy, cottonseed and coconut. Such fatty acids, salts and mixtures are either commercially available or may be manufactured by techniques known in the art. In general, such fatty acids and salts thereof may be included in the hot melt ink resists in amounts of at least 60 wt %, or such as from 65 wt % to 90 wt %, or such as from 70 wt % to 80 wt %.

Optionally, the hot melt ink resists include one or more optical brighteners. Conventional optical brighteners, such as fluorescent whitening agents, may be used. Such optical brighteners include, but are not limited to, 4,4'-bis[2-(2-methoxyphenyl)ethenyl]-1,1'-biphenyl; 1,4-bis(2-cyano styryl) benzene; 2,2'-(1,4-naphthalenediyl)bisbenzoxazole; 2,2'-(2,5-thiophenediyl)bis[5-(1,1-dimethylethyl)]-benzoxazole; 2,5-thiophenediylbis(5-tert-butyl-1,3-benzoxazole); and 2,2'-(1,2-ethenediyldi-4,1-phenylene)bisbenzoxazole. Examples of commercially available fluorescent white agents are UVITEX™ FP and UVITEX™ OB by Ciba Switzerland and BLANKOPHOR™ ER by Bayer A.G., Germany. Such optical brighteners may be included in the hot melt ink resists in amounts of 0.01 wt % to 1 wt % or such as from 0.05 wt % to 0.1 wt %.

The etchant may be applied to the semiconductor substrate with the selectively applied hot melt ink resist coating the antireflective layer or the doped emitter layer by any suitable method known in the art. Such methods include, but are not limited to, immersion of the semiconductor substrate in an etchant bath, selectively applying by inkjet printing, aerosol or using conventional spray apparatus. The etchant is applied at mild temperatures in contrast to many conventional etching processes. The mild temperatures help reduce or prevent attack on the resist, thus the ink resist maintains its integrity during etching and inhibits undercutting by the etchant. Etch temperatures range from room temperature to 50° C. or such as from 25° C. to 40° C.

The etchant includes one or more inorganic acids and, optionally, one or more polyols with the balance water. The etchant is applied for a period of 80 seconds or less, typically from 5 seconds to 60 seconds, most typically from 20 seconds to 40 seconds.

Inorganic acids include, but are not limited to, hydrofluoric acid, hydrochloric acid, sulfuric acid, nitric acid and phosphoric acid. Typically the inorganic acids are provided in aqueous form as a concentrated or dilute aqueous solution. Most typically, the inorganic acid is hydrofluoric acid. The inorganic acids may be included in amounts of 1 wt % to 20 wt % of the etchant.

The polyols are typically water soluble at room temperature and are compatible with inorganic acids such that there are no stability problems. Such polyols include, but are not limited to, glycols, such as polyhydric alcohols, such as ethylene glycol, polyethylene glycol, propylene glycol, polypropylene glycol, butylene glycol, polybutylene glycol, dipropylene glycol, tripropylene glycol, and glycerin. Preferably, the polyol is chosen from ethylene glycol and propylene glycol. Such polyols may be included in the etchant in amounts of 20% by volume to 80% by volume, or such as from 40% by volume to 70% by volume, or such as from 50% by volume to 60% by volume.

In addition to the inorganic acids and polyols, ammonium compounds may also be included in the etchant. Typically, the etchant includes one or more ammonium compounds. Ammonium compounds include, but are not limited to, ammonium fluoride and ammonium bifluoride. Typically the ammonium compound is ammonium fluoride. Typically the ammonium compounds are provided as aqueous concentrates or as dilute solutions. Such ammonium compounds may be included in amounts of 10 wt % to 40 wt % of the etchant.

Typically when an ammonium compound is included in the etchant the volume ratio of ammonium compound to inorganic acid is 10:1 to 4:1. A preferred etchant is aqueous ammonium fluoride and aqueous hydrogen fluoride at a volume to volume ratio of 10:1 to 4:1 with one or more polyols in amounts of 40% to 60% by volume. The balance of the formulation may be water.

The combination of the hot melt ink resist and the etchant inhibits undercutting such that the current lines have substantially uniform widths and substantially no tributary formation with adjacent current lines. The combination of the hot melt ink resist and the etchant inhibit capillary action at the interface of the hot melt ink resist and the antireflective layer or coated emitter layer which typically causes etchant to seep under the hot melt resulting in undercutting and ultimately with current lines having irregular dimensions and inefficient current conduction.

When etching is complete, the semiconductor may be rinsed with water to remove any etchant. The hot melt ink resist is then stripped from the semiconductor substrate. The acid number for the entire hot melt ink resist ranges from at least 190, or such as from 190 to 250, or such as from 200 to 230 (mg KOH/g). The hot melt ink resist is stripped with a dilute aqueous alkaline solution, such as potassium hydroxide or sodium hydroxide. The hydroxide concentration may range from 0.1 wt % to 5 wt %. Such mild aqueous alkaline solutions are applied at temperatures from room temperature to 50° C. Stripping is rapid and may take from one minute or less. Stripping of the resist is substantially complete. The resist dissolves from the surface of the $SiO_x$ or silicon nitride layer or emitter layer as opposed to lifting or floating away as many conventional resists. Minor amounts of residue may be rinsed from the semiconductor with water.

After etching and stripping metallization of the substrate is then done. However, in the selective emitter embodiment an antireflective layer may be deposited on the etched portions of the emitter layer using the materials and methods for forming an antireflective layer as described above. The portions of the emitter layer which were coated with the hot melt ink resist have a higher doping than the etched portions and are the portions of the emitter layer which are metal plated to form the current lines on the front side of the semiconductor.

Prior to front side metallization of either embodiment, the back side of the semiconductor wafer is metalized, such as with aluminum, to provide a low resistance wafer. Any conventional method may be used. Typically, the surface resistance, also known as sheet resistance, of the semiconductor wafer may range from 40 to 90 ohms/square.

A layer of metal is then deposited on the front side current lines. Typically a silver paste is applied to the current lines and fired. This is typically followed by light induced metal plating. Metals, include, but are not limited to, silver, copper, and nickel. If the source of the metal is an electroless bath, plating is done without application of external current. If the source of the metal is from an electrolytic bath, a rear side potential (rectifier) is applied to the semiconductor wafer substrate. Examples of commercially available electroless nickel baths are DURAPOSIT™ SMT 88 and NIPOSIT™ PM 980 and PM 988. Examples of commercially available electrolytic nickel baths are the NICKEL GLEAM™ series of electrolytic products. Examples of commercially available copper electroplating baths are COPPER GLEAM™ ST 901 and 901. An example of a commercially useful silver plating bath is available as ENLIGHT™ 620 silver plate. All of the above commercially available baths are obtainable from Rohm and Haas Electronic Materials, LLC Marlborough, Mass.

The light may be continuous or pulsed. The semiconductor is immersed in the metal plating bath and light is applied to the semiconductor resulting on metal plating in the current lines. Light sources include, but are not limited to, incandescent lamps, LED lights (light emitting diodes), infrared lamps, fluorescent lamps, mercury lamps, halogen lamps and lasers.

Typical current densities are from 0.1 $A/dm^2$ to 5 $A/dm^2$. The particular current requirement is dependent upon the particular size of the wafer used. The electroplating processes used are conventional. Typically, such metal layers range from 1 μm to 50 μm, more typically, from 5 μm to 25 μm thick.

The following examples are included to illustrate various aspects of the invention but are not intended to limit the scope of the invention.

EXAMPLES 1

Comparative

A hot melt inkjet resist having the formula disclosed in the table below was prepared. The resist was a solid at room temperature.

| COMPONENT | AMOUNT |
|---|---|
| Partially hydrogenated rosin resin[1] | 24.9 wt % |
| Myristic acid | 75 wt % |
| 2,5-thiophenediylbis(5-tert-butyl-1,3-benzoxazole)[2] | 0.1 wt % |

[1]STAYBELITE ® A typical composition and properties: abietic acid <3 wt %, dehydroabietic acid 6-10 wt %, dihydroabietic acid 60-80 wt %, tetrahydroabietic acid 5-15 wt %, other resin acids and neutrals 10-15 wt %, softening point, Ring & Ball, ° C. = 65-69, acid number 158-160.
[2]UVITEX OB ™: optical brightener.

The hot melt was placed in the reservoir of a DirectMask™ DoD 65 inkjet printer (obtainable from Schmid GmbH, Freudenstadt, Germany). The temperature in the reservoir was raised to 75° C. to melt the hot melt resist. The resist was selectively printed on the silicon dioxide coating of twelve monocrystalline silicon wafers at room temperature to form an "H" pattern on the wafers.

The line width for the etched wafer was then measured using a PAXcam digital microscope camera with bundled PAX-it image analysis software from MIS, Inc. (Surgoinsville, Tenn., U.S.A.). The line width was measured across the edges of the resist deposit. The average line width for the twelve wafers was determined to be 54.2 μm±3.2.

An aqueous etching solution composed of ammonium fluoride and hydrogen fluoride in a volume to volume ratio of 6:1 was prepared from 40 wt % aqueous ammonium fluoride and 49 wt % aqueous hydrogen fluoride. The etchant was applied to the monocrystalline silicon wafers at 30° C. by immersing the wafers in the etch solution. The wafers remained in contact with the solution for 25 seconds. The wafers were then removed from the etch solution and rinsed with water at room temperature to remove etchant and etching residue.

The hot melt resist was then stripped from the wafers using an aqueous alkaline solution of 0.5 wt % potassium hydroxide by immersing the wafers in the stripping solution at 40° C. The line width of the wafers after stripping was determined using the PAXcam digital microscope camera with bundled PAX-it image analysis software. The average line width was determined to be 79.9 μm±4.4. The increase in width was due to the etchant undercutting the hot melt resist. The undercut was determined to be 12.8 μm/side (line width after stripping–line width before stripping/2).

EXAMPLE 2

Comparative

The method described in Example 1 was repeated using another set of twelve wafers with silicon dioxide coatings. The same hot melt inkjet resist was used to form the "H" pattern on the wafers and the wafers were etched with the same etching solution. The line widths were measured with the same PAXcam digital microscope and bundled PAX-it image analysis software as in Example 1. The average line width for the wafers as printed was 58.5 μm±4.4 and the average line width after etching and stripping was measured to be 69.7 μm±2.5. The undercut was determined to be 5.6 μm/side.

EXAMPLE 3

The method described in Example 1 was repeated except that the etchant included 50% by volume of ethylene glycol in addition to aqueous ammonium fluoride and aqueous hydrogen fluoride at a volume to volume ratio of 6:1.

Twelve monocrystalline wafers of the types used in Examples 1 and 2 with coatings of silicon dioxide were selectively coated with the hot melt inkjet resist disclosed in the Table in Example 1 to form the "H" pattern. The line widths were measured with the PAXcam digital microscope. The average line width for the first set of wafers after printing was 49.5 μm±4.4 and the average line width after printing of the second set of wafers was 52.0 μm±3.3. The average line width after etching and stripping the hot melt resist from the first set of wafers with the aqueous alkaline solution was 49.2 μm±2.2, and 52.0 μm±4.5 for the second set of wafers. The undercuts for the first set of wafers was determined to be 0.15 μm/side and for the second set 0 μm/side. The method of the invention significantly reduced undercuts in silicon dioxide coated monocrystalline wafers in contrast to those in Examples 1 and 2.

What is claimed is:

1. A method comprising:
  a) providing a semiconductor comprising a front side and a back side, the front side comprises an antireflective layer composed of $SiO_x$ or silicon nitride;
  b) selectively applying a hot melt ink resist comprising one or more hydrogenated rosin resins having acid functional groups, and one or more fatty acids to the antireflective layer, the hot melt ink resist has an acid number of at least 190; and
  c) applying an etch composition comprising one or more inorganic acids to the semiconductor to etch away exposed portions of the semiconductor antireflective layer and simultaneously inhibit undercutting of the hot melt ink resist.

2. The method of claim 1, wherein the hydrogenated rosin resin is derived from abietic acid or pimaric acid.

3. The method of claim 1, wherein the hydrogenated rosin resin is included in amounts of at least 10 wt %.

4. The method of claim 1, wherein the fatty acid is included in amounts of at least 60 wt %.

5. The method of claim 1, wherein the inorganic acid is chosen from hydrogen fluoride, sulfuric acid or hydrochloric acid.

6. The method of claim 1, wherein the etch composition further comprises one or more ammonium compounds.

7. The method of claim 1, wherein the etch composition further comprises one or more polyols.

8. The method of claim 7, wherein the one or more polyols are chosen from ethylene glycol, polyethylene glycol, propylene glycol, polypropylene glycol, butylene glycol, polybutylene glycol, dipropylene glycol, tripropylene glycol, and glycerin.

9. The method of claim 1, wherein the hot melt inkjet resist is selectively applied at a temperature of 95° C. or less.

10. The method of claim 1, wherein the etchant is applied at room temperature to 50° C.

11. The method of claim 1, wherein the polyol is included in amounts of 20% to 80% by volume.

12. A method comprises:
  a) providing a semiconductor comprising a front side and a back side, the front side comprises a doped emitter layer,
  b) selectively applying a hot melt ink resist comprising one or more hydrogenated rosin resins having acid functional groups, and one or more fatty acids to the doped emitter layer, the hot melt ink resist has an acid number of at least 190; and
  c) applying an etch composition comprising one or more inorganic acids to the semiconductor to etch away exposed portions of the doped emitter layer and simultaneously inhibiting undercutting of the hot melt ink resist.

13. The method of claim 12, wherein the hydrogenated rosin resin is derived from abietic acid or pimaric acid.

14. The method of claim 12, wherein the inorganic acid is chosen from hydrogen fluoride, sulfuric acid or hydrochloric acid.

15. The method of claim 12, wherein the etch composition further comprises one or more ammonium compounds.

16. The method of claim 12, wherein the etch composition further comprises one or more polyol.

17. The method of claim 16, wherein the one or more polyols are chosen from ethylene glycol, polyethylene glycol, propylene glycol, polypropylene glycol, butylene glycol, polybutylene glycol, dipropylene glycol, tripropylene glycol, and glycerin.

* * * * *